(12) United States Patent
Lin et al.

(10) Patent No.: US 11,201,135 B2
(45) Date of Patent: *Dec. 14, 2021

(54) THREE DIMENSIONAL INTEGRATED CIRCUITS STACKING APPROACH

(71) Applicant: Taiwan Semiconductor Manufacturing Co., Ltd., Hsin-Chu (TW)

(72) Inventors: Jing-Cheng Lin, Hsinchu (TW); Shang-Yun Hou, Jubei (TW)

(73) Assignee: Taiwan Semiconductor Manufacturing Co., Ltd., Hsinchu (TW)

(*) Notice: Subject to any disclaimer, the term of this patent is extended or adjusted under 35 U.S.C. 154(b) by 199 days.

This patent is subject to a terminal disclaimer.

(21) Appl. No.: 15/299,961

(22) Filed: Oct. 21, 2016

(65) Prior Publication Data

US 2017/0040290 A1    Feb. 9, 2017

Related U.S. Application Data

(60) Continuation of application No. 14/959,094, filed on Dec. 4, 2015, now Pat. No. 9,502,380, which is a
(Continued)

(51) Int. Cl.
*H01L 23/13* (2006.01)
*H01L 25/065* (2006.01)
(Continued)

(52) U.S. Cl.
CPC ........ *H01L 25/0652* (2013.01); *H01L 21/486* (2013.01); *H01L 21/4853* (2013.01);
(Continued)

(58) Field of Classification Search
CPC ............ H01L 23/481; H01L 23/49822; H01L 23/49816; H01L 23/3128; H01L 24/05;
(Continued)

(56) References Cited

U.S. PATENT DOCUMENTS 5,977,640 A * 11/1999 Bertin ................. H01L 25/0657
  257/686
7,582,953 B2 * 9/2009 Lin .................... H01L 23/49575
  257/666

(Continued)

OTHER PUBLICATIONS

English translation of Decision of Refusal of Amendment dated Sep. 8, 2015 from corresponding No. KR 10-2012-0151681.
(Continued)

*Primary Examiner* — Hoa B Trinh
(74) *Attorney, Agent, or Firm* — Eschweiler & Potashnik, LLC

(57) ABSTRACT

A semiconductor package and a method of forming a semiconductor package with one or more dies over an interposer are provided. In some embodiments, the semiconductor package has a plurality of through substrate vias (TSVs) extending through an interposer substrate. A redistribution structure is arranged over a first surface of the interposer substrate, and a first die is bonded to the redistribution structure. An edge of the first die is beyond a nearest edge of the interposer substrate. A second die is bonded to the redistribution structure. The second die is laterally separated from the first die by a space.

20 Claims, 8 Drawing Sheets

Related U.S. Application Data division of application No. 13/630,149, filed on Sep. 28, 2012, now Pat. No. 9,209,156.

(51) Int. Cl.

| | | |
|---|---|---|
| *H01L 23/00* | (2006.01) | |
| *H01L 23/31* | (2006.01) | |
| *H01L 21/56* | (2006.01) | |
| *H01L 21/48* | (2006.01) | |
| *H01L 25/00* | (2006.01) | |
| *H01L 23/498* | (2006.01) | |
| *H01L 21/683* | (2006.01) | |
| *H01L 21/60* | (2006.01) | |

(52) U.S. Cl.
CPC .......... *H01L 21/561* (2013.01); *H01L 21/563* (2013.01); *H01L 21/568* (2013.01); *H01L 23/3128* (2013.01); *H01L 23/49816* (2013.01); *H01L 23/49822* (2013.01); *H01L 23/49827* (2013.01); *H01L 24/05* (2013.01); *H01L 24/20* (2013.01); *H01L 24/96* (2013.01); *H01L 24/97* (2013.01); *H01L 25/0657* (2013.01); *H01L 25/50* (2013.01); *H01L 21/6836* (2013.01); *H01L 24/13* (2013.01); *H01L 24/16* (2013.01); *H01L 24/81* (2013.01); *H01L 2021/6006* (2013.01); *H01L 2021/6024* (2013.01); *H01L 2224/0237* (2013.01); *H01L 2224/02331* (2013.01); *H01L 2224/02379* (2013.01); *H01L 2224/0401* (2013.01); *H01L 2224/04105* (2013.01); *H01L 2224/05024* (2013.01); *H01L 2224/05541* (2013.01); *H01L 2224/12105* (2013.01); *H01L 2224/131* (2013.01); *H01L 2224/13147* (2013.01); *H01L 2224/16145* (2013.01); *H01L 2224/16225* (2013.01); *H01L 2224/16227* (2013.01); *H01L 2224/17181* (2013.01); *H01L 2224/32227* (2013.01); *H01L 2224/73204* (2013.01); *H01L 2224/81024* (2013.01); *H01L 2224/96* (2013.01); *H01L 2224/97* (2013.01); *H01L 2225/06517* (2013.01); *H01L 2225/06541* (2013.01); *H01L 2225/06572* (2013.01); *H01L 2924/00* (2013.01); *H01L 2924/00014* (2013.01); *H01L 2924/1305* (2013.01); *H01L 2924/1306* (2013.01); *H01L 2924/13091* (2013.01); *H01L 2924/181* (2013.01); *H01L 2924/351* (2013.01)

(58) Field of Classification Search
CPC ......... H01L 24/96; H01L 24/20; H01L 24/97; H01L 21/568; H01L 21/486; H01L 21/4853; H01L 21/561; H01L 21/563; H01L 25/50; H01L 25/0652; H01L 25/0657

See application file for complete search history.

(56) References Cited

U.S. PATENT DOCUMENTS

| | | | |
|---|---|---|---|
| 8,212,348 B2* | 7/2012 | Bolken | H01L 23/3128 |
| | | | 257/686 |
| 8,890,329 B2 | 11/2014 | Kim et al. | |
| 8,993,377 B2* | 3/2015 | Koo | H01L 21/561 |
| | | | 257/E21.499 |
| 9,209,156 B2* | 12/2015 | Len | H01L 24/05 |
| 9,287,204 B2 | 3/2016 | Kim | |
| 9,875,911 B2* | 1/2018 | Pagaila | H01L 21/56 |
| 2008/0157316 A1 | 7/2008 | Yang | |
| 2008/0157396 A1 | 7/2008 | Yang | |
| 2008/0246126 A1 | 10/2008 | Bowles | |
| 2009/0102037 A1* | 4/2009 | Kim | H01L 23/49816 |
| | | | 257/686 |
| 2011/0159639 A1 | 6/2011 | Yee | |
| 2012/0061849 A1* | 3/2012 | Coffy | H01L 23/3128 |
| | | | 257/774 |
| 2012/0074587 A1 | 3/2012 | Koo | |
| 2012/0119388 A1* | 5/2012 | Cho | H01L 21/56 |
| | | | 257/778 |
| 2012/0211885 A1 | 8/2012 | Choi et al. | |
| 2012/0256322 A1* | 10/2012 | Itou | H01L 21/563 |
| | | | 257/778 |
| 2013/0075927 A1* | 3/2013 | Chi | H01L 23/3135 |
| | | | 257/774 |
| 2013/0093073 A1 | 4/2013 | Chen et al. | |
| 2018/0102311 A1* | 4/2018 | Shih | H01L 23/49838 |

OTHER PUBLICATIONS

English translation of Notice of Final Rejection dated Sep. 8, 2015 from corresponding No. KR 10-2012-0151681.

English translation of Office Action dated Jan. 27, 2015 from corresponding No. KR 10-2012-0151681.

Non-Final Office Action dated Oct. 24, 2014 for U.S. Appl. No. 13/630,149.

Non-Final Office Action dated Mar. 18, 2015 for U.S. Appl. No. 13/630,149.

Notice of Allowance dated Aug. 3, 2015 for U.S. Appl. No. 13/630,149.

U.S. Appl. No. 61/665,123, filed Jun. 27, 2012.
U.S. Appl. No. 13/619,877, filed Sep. 14, 2012.
U.S. Appl. No. 13/427,753, filed Mar. 22, 2012.
U.S. Appl. No. 13/338,820, filed Dec. 28, 2011.

Non-Final Office Action dated Feb. 17, 2016 for U.S. Appl. No. 14/959,094.

Notice of Allowance dated Jul. 13, 2016 for U.S. Appl. No. 14/959,094.

Final Office Action dated Dec. 20, 2019 for U.S. Appl. No. 16/152,561.

Non-Final Office Action dated Jun. 20, 2019 for U.S. Appl. No. 16/152,561.

* cited by examiner

THREE DIMENSIONAL INTEGRATED CIRCUITS STACKING APPROACH

REFERENCE TO RELATED APPLICATIONS

This Application is a Continuation of U.S. application Ser. No. 14/959,094 filed on Dec. 4, 2015, which is a Divisional of U.S. application Ser. No. 13/630,149 filed on Sep. 28, 2012 (now U.S. Pat. No. 9,209,156 issued on Dec. 8, 2015). The contents of both applications are hereby incorporated by reference in their entirety. In addition, the present application is related to U.S. provisional Application No. 61/665,123, entitled "3DIC Stacking Device and Method of Manufacture," filed on Jun. 27, 2012, and U.S. patent application Ser. No. 13/619,877, entitled "3DIC Stacking Device and Method of Manufacture," filed on Sep. 14, 2012. Both above-mentioned applications are incorporated herein by reference in their entireties.

BACKGROUND

With the continued evolution of semiconductor technologies, semiconductor chips/dies are becoming increasingly smaller. In the meantime, more functions are being integrated into the semiconductor dies. Accordingly, the semiconductor dies have increasingly greater numbers of input/output (I/O) pads packed into smaller areas. As a result, the packaging of the semiconductor dies becomes more important and more challenging.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

Since the invention of the integrated circuit, the semiconductor industry has experienced continual rapid growth due to continuous improvements in the integration density of various electronic components (i.e., transistors, diodes, resistors, capacitors, etc.). For the most part, this improvement in integration density has come from repeated reductions in minimum feature size, allowing for the integration of more components into a given area.

These integration improvements are essentially two-dimensional (2D) in nature, in that the volume occupied by the integrated components is essentially on a surface of a semiconductor wafer. Although dramatic improvements in lithography have resulted in considerable improvements in 2D integrated circuit formation, there are physical limits to the density that can be achieved in two dimensions. One of these limits is the minimum size needed to make these components. Also, when more devices are put into one chip, more complex designs are required.

Three-dimensional integrated circuits (3D ICs) have been therefore created to resolve the above-discussed limitations. In some formation processes of 3D ICs, two or more wafers, each including an integrated circuit, are formed. The wafers are then bonded with the integrated circuits aligned. Through-substrate-vias (TSVs), also referred to as through-silicon-vias or through-wafer vias, are increasingly used as a way of implementing 3D ICs. TSVs are often used in 3D ICs and stacked dies to provide electrical connections and/or to assist in heat dissipation. There are challenges in forming TSVs in 3D ICs and stacked dies.

Figure 1A:
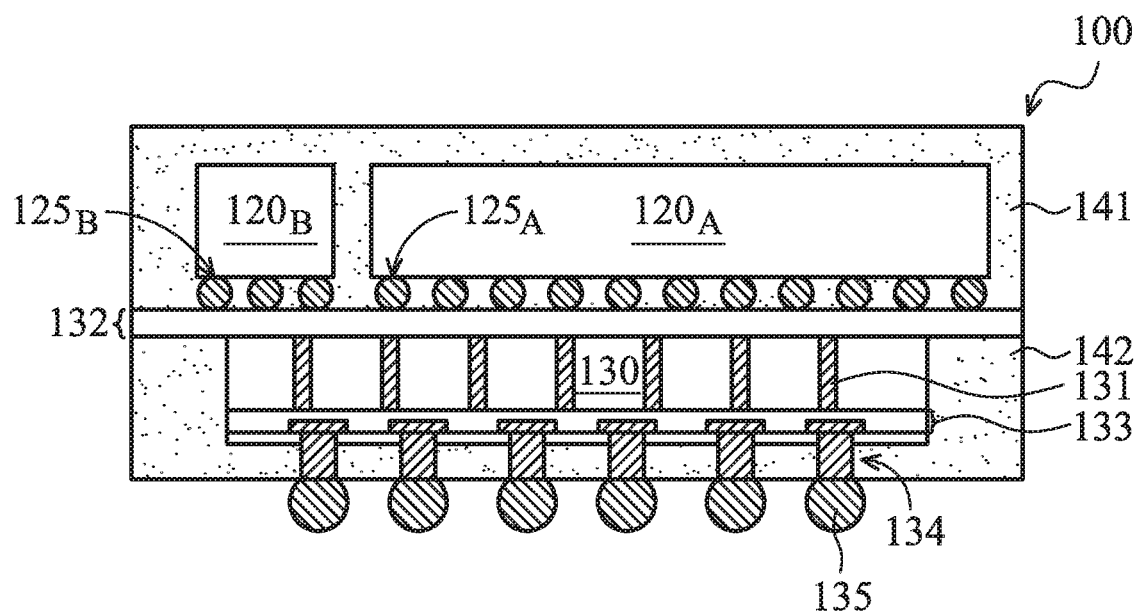
FIGS. 1A-1C show cross-sectional views of packages, in accordance with some embodiments.

FIG. 1A shows a cross-sectional view of a package 100, in accordance with some embodiments. Package 100 includes two semiconductor dies, 120$_A$ and 120$_B$, bonded to another semiconductor die 130. In some embodiments, each of the semiconductor dies, 120$_A$ and 120$_B$, includes a semiconductor substrate as employed in a semiconductor integrated circuit fabrication, and integrated circuits may be formed therein and/or thereupon. The semiconductor substrate refers to any construction comprising semiconductor materials, including, but not limited to, bulk silicon, a semiconductor wafer, a silicon-on-insulator (SOI) substrate, or a silicon germanium substrate. Other semiconductor materials including group III, group IV, and group V elements may also be used. The semiconductor substrate may further comprise a plurality of isolation features (not shown), such as shallow trench isolation (STI) features or local oxidation of silicon (LOCOS) features. The isolation features may define and isolate the various microelectronic elements. Examples of the various microelectronic elements (not shown) that may be formed in the semiconductor substrate include transistors (e.g., metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), etc.); resistors; diodes; capacitors; inductors; fuses; and other suitable elements.

Various processes are performed to form the various microelectronic elements including deposition, etching, implantation, photolithography, annealing, and/or other suitable processes. The microelectronic elements are interconnected to form the integrated circuit device, such as a logic device, memory device (e.g., SRAM), RF device, input/output (I/O) device, system-on-chip (SoC) device, combinations thereof, and other suitable types of devices.

Die 130 includes TSVs 131. Die 130 may include various passive and active microelectronic devices (not shown), such as resistors, capacitors, inductors, diodes, metal-oxide-semiconductor field effect transistors (MOSFETs), complementary MOS (CMOS) transistors, bipolar junction transistors (BJTs), laterally diffused MOS (LDMOS) transistors, high power MOS transistors, FinFET transistors, other types of transistors, and/or any combinations thereof. Die 130 is an interposer, which provides an electrical connection and/or to assist in heat dissipation in a 3-dimensional (3-D) package system, in accordance with some embodiments. Interposers with active devices may be referred to as active interposers. Interposers without active devices may be referred to as passive interposers.

Die 130 in FIG. 1A also includes redistribution structure 132. Redistribution structure 132 includes layers RDLs (or RDL, not shown) to enable fan-out for dies 130, $120_A$, and/or $120_B$. By enabling fan-out for die 130, die $120_A$ and/or $120_B$ can have edges beyond the edges of die 130, as shown in FIG. 1A.

Redistribution structure 132 also includes dielectric layer(s), which is protects and isolate RDLs. RDLs of redistribution structure 132 expand interconnection beyond the edges of dies 130, $120_A$, and/or $120_B$. Dies $120_A$ and $120_B$ are bonded to RDLs of die 130 via bonding structures $125_A$ and $125_B$ to make connections with TSVs 131. Die 130 has interconnect structure 133 on an opposite side of redistribution structure 132 to provide electrical connections between devices (not shown) of die 130, TSVs 131 and connection structures 134, which are connected to external connectors 135. In some embodiments, nterconnect structure 133 includes metal lines and vias. External connectors 135 may be bonded to a substrate, such as a printed circuit board (PCB), or another package structure. Connection structures 134 are surrounded by a protective layer 145, in accordance with some embodiments. The protective layer 145 is made of a polymer, such as polyimide, polybenzoxazole (PBO), or benzocyclobutene (BCB), in some embodiments.

Exemplary structures of redistribution structures 132 and bonding structures $125_A$ and $125_B$, and methods of forming them are described in U.S. application Ser. No. 13/427,753, entitled "Bump Structures for Multi-Chip Packaging," filed on Mar. 22, 2012, and U.S. application Ser. No. 13/338,820, entitled "Packaged Semiconductor Device and Method of Packaging the Semiconductor Device," filed on Dec. 28, 2011. Both above-mentioned applications are incorporated herein by reference in their entireties.

Figure 1B:
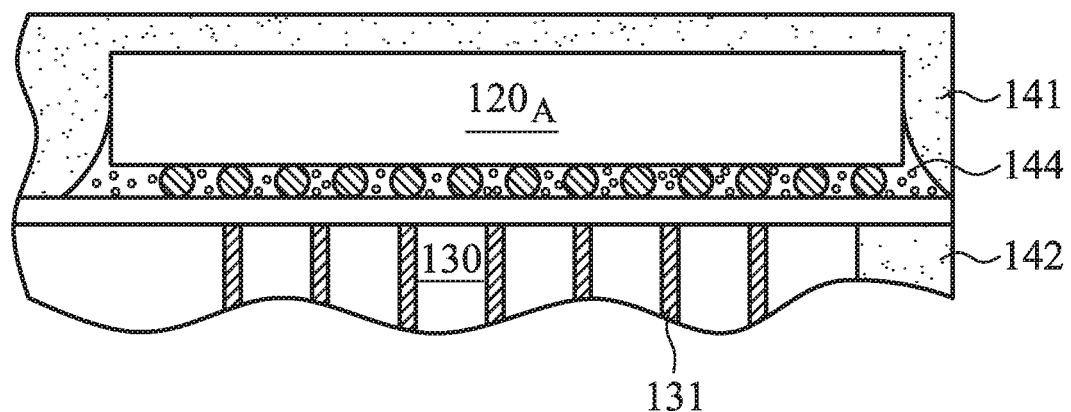

Dies $120_A$ and $120_B$ are covered by a molding compound 141 and die 130 is covered by a molding compound 142. In some embodiments, the molding compounds 141 and 142 include epoxy, silicon, silica filler, and/or other types of polymers. Molding compound 141 and molding compound 142 are made of the same material, in some embodiments. In some embodiments, there is an underfill between each of dies $120_A$ and $120_B$ and die 130. FIG. 1B shows an underfill 144 fills the space between die $120_A$ and redistribution structure 132 of die 130, in accordance with some embodiments. Underfill 144 may, for example, comprise a liquid epoxy that is dispensed to fill the space. The underfill material may be used to prevent cracks from being formed in and near bonding structures $125_A$, wherein cracks are typically caused by thermal stresses. Alternatively, either a deformable gel or silicon rubber could be formed between the die $120_A$ and die 130. This gel or silicon rubber may be formed by injecting or otherwise placing the gel or rubber between these two dies. The deformable gel or silicon rubber may also provide stress relief during subsequent processing. Underfill 144 can also be formed between dies $120_B$ and 130.

Figure 1C:
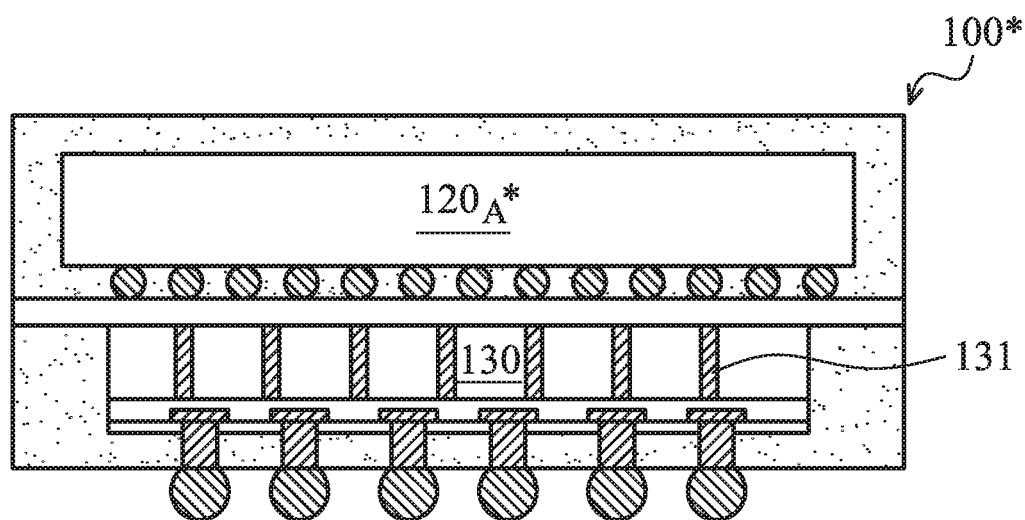

In some embodiments, the space between each of dies $120_A$ and $120_B$ and die 130 is filled by molding compound 141. Under such circumstance, molding compound 141 is a molding underfill (MUF). FIG. 1A shows two dies $120_A$ and $120_B$ are bonded to die 130 with TSVs 131. However, one die, such as $120_A$*, could be bonded to die 130 to form package 100*, as shown in FIG. 1C in accordance with some embodiments.

Figure 2:
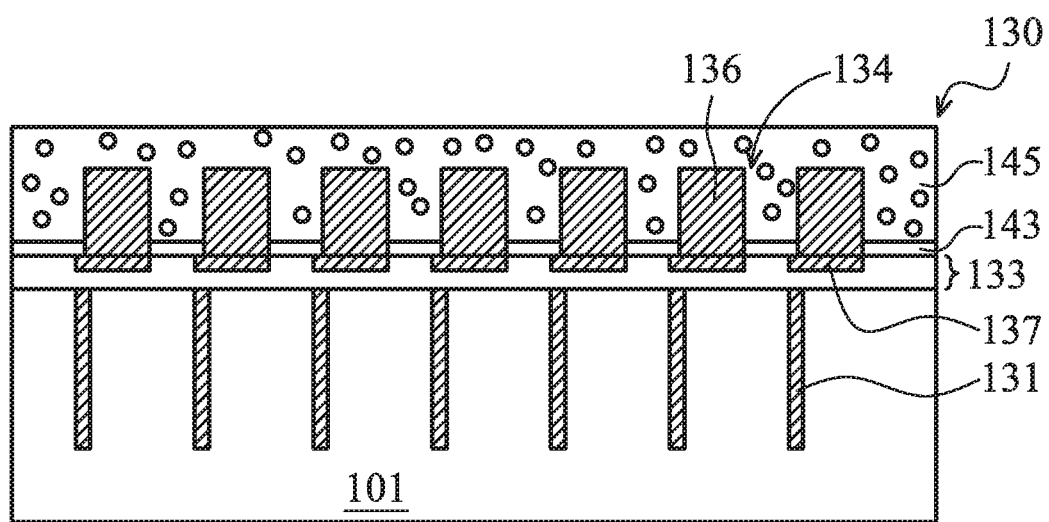
FIG. 2 shows a cross-sectional view of a die, in accordance with some embodiments.

FIG. 2 shows a cross-sectional view of die 130 before being bonded to other die(s), in accordance with some embodiments. FIG. 2 shows die 130 has TSVs 131 and connection structures 134, which are to be connected to external connectors 135, as described above. TSVs 131 are formed in substrate 101. Connection structures 134 may include metal post 136 over metal pad 137 and are insulated from one another by dielectric layer(s) 143, in accordance with some embodiments. Dielectric layer(s) 143 is made of polymers, such as polyimide, in some embodiments and can be call a passivation layer(s). Metal posts 136 could be made of copper, copper alloy, other types of metal, other types of metal alloy, or combination thereof. Metal pad 137 may be made of aluminum, aluminum alloy, copper, copper alloy, other types of metal, other types of alloy, or combination thereof. In some embodiments, there is an under bump metallurgy (UBM) layer (not shown) between metal pad 137 and metal posts 136. The UBM layer acts as a diffusion barrier layer between metal pad 137 and metal posts 136 and may also act as a plating-enabling layer.

Exemplary structures and methods of forming connection structures 134 are described in U.S. application Ser. No. 13/427,753, entitled "Bump Structures for Multi-Chip Packaging," filed on Mar. 22, 2012, and U.S. application Ser. No. 13/338,820, entitled "Packaged Semiconductor Device and Method of Packaging the Semiconductor Device," filed on Dec. 28, 2011. Both above-mentioned applications are incorporated herein by reference in their entireties.

FIG. 2 shows that the metal post 136 and an exposed surface of die 130 next to metal post 136 are covered by the protective layer 145 described in FIG. 1A. In some embodiments, the protective layer 145 is made of a polymer, such as polyimide, polybenzoxazole (PBO), or benzocyclobutene (BCB). However, other materials may also be used.

Figure 3A:
FIGS. 3A-3J show cross-sectional views of a sequential process flow of forming a die package, in accordance with some embodiments.
Figure 3B:
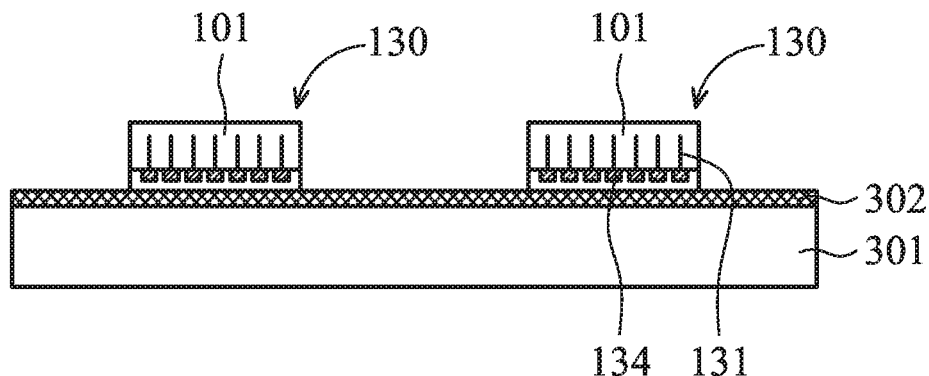
Figure 3C:
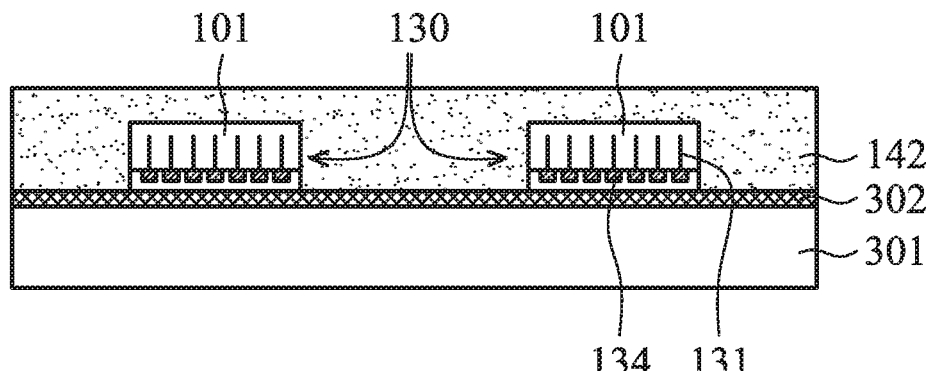

FIGS. 3A-3J show cross-sectional views of a sequential process flow of forming a die package 100*, in accordance with some embodiments. FIG. 3A shows an adhesive layer 302, which is over a carrier 301. Carrier 301 is made of glass, in accordance with some embodiments. However, other materials may also be used for carrier 301. Adhesive layer 302 is deposited or laminated over carrier 301, in some embodiments. Adhesive layer 302 may be formed of a glue, or may be a lamination layer formed of a foil. Afterwards, dies 130 are placed over adhesive layer 302, as shown in FIG. 3B in accordance with some embodiments. The side with connection structures 134 faces adhesive layer 302. Dies 130 adhere to adhesive layer 302. Afterwards, molding compound 142 is formed over dies 130, as shown in FIG. 3C in accordance with some embodiments.

The formation of the molding compound 142 involves depositing a liquid molding compound on adhesive layer 302 to cover dies 130 and performing a thermal reflow, in some embodiments. For example, the liquid molding compound could be monomers or not-fully linked polymers. The thermal reflow polymerizes the monomers and/or non-fully linked polymers in the liquid molding compound to become solid molding compound 142. The thermal reflow may also evaporate solvent used in forming the liquid molding compound.

Figure 3D:
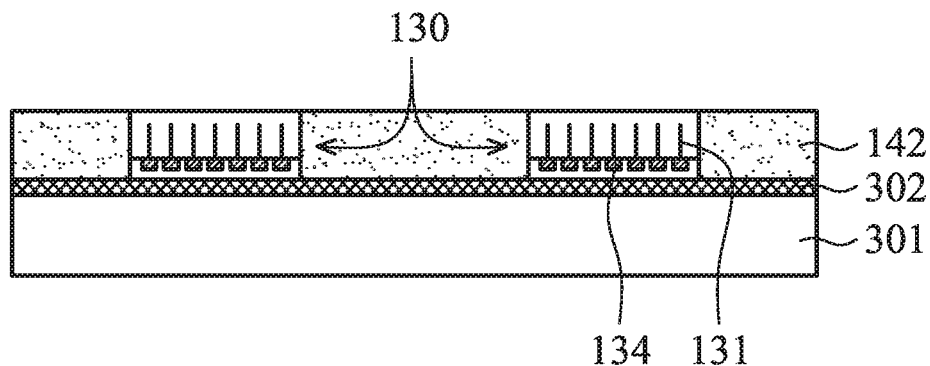
Figure 3E:
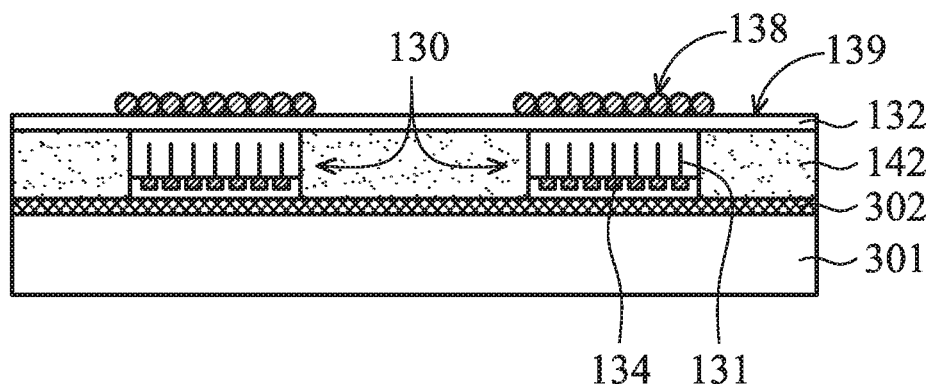

Afterwards, excess molding compound 142 and a portion of substrate 101 are removed to expose TSVs 131 on die 130, as shown in FIG. 3D in accordance with some embodiments. The removal process could be grinding, polishing, or other applicable process. After the excess molding compound 142 is removed, redistribution structure 132 and bump structures 138 are formed over surface 139 of exposed TSVs 131, as shown in FIG. 3E in accordance with some embodiments. As mentioned above, redistribution structure 132 includes layers RDLs to enable fan-out for dies 130 and also dies bonded to dies 130, such as dies $120_A*$. Redistribution structure 132 also includes dielectric layer(s), which is protects and isolate RDLs. Bump structures 138 are formed over redistribution structure 132 to enable connecting die 130 to other die(s). Bump structures 138 may be solder bumps, copper posts, or other applicable bump structures. In some embodiments, bump structures 138 are microbumps with widths in a range from about 5 μm to about 30 μm.

Exemplary bump structures 138 are also described in U.S. application Ser. No. 13/427,753, entitled "Bump Structures for Multi-Chip Packaging," filed on Mar. 22, 2012, and U.S. application Ser. No. 13/338,820, entitled "Packaged Semiconductor Device and Method of Packaging the Semiconductor Device," filed on Dec. 28, 2011. Both above-mentioned applications are incorporated herein by reference in their entireties.

Figure 3F:
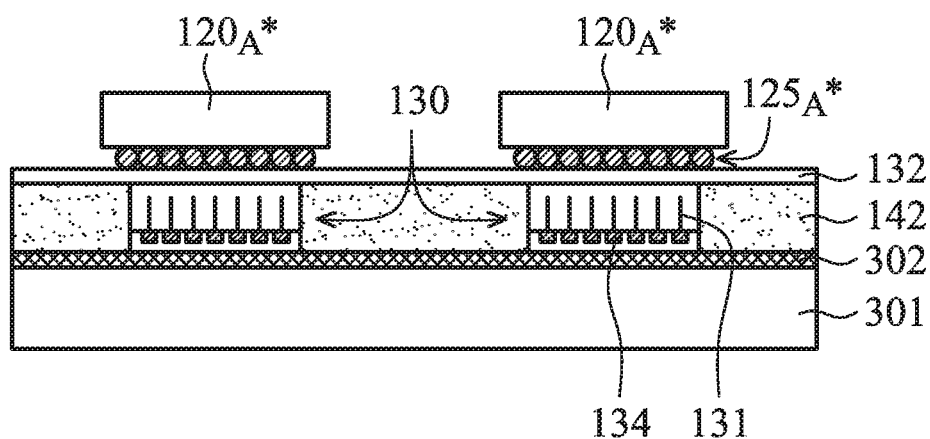

Following the formation of redistribution structure 132 and bump structures 138, dies $120_A*$ are placed over redistribution structure 132 and bump structures 138 of dies 130, as shown in FIG. 3F in accordance with some embodiments. The bump structures (not shown) of dies $120_A*$ are aligned with bump structures 138 of die 130. In some embodiments, a flux (not shown) is applied over the redistribution structure 132 and the bump structures 138 prior to placing dies $120_A*$ over them. The flux prevents oxidation of the bump structures 138 and also enables the placement of dies $120_A*$ over die 130. In some embodiments, a thermal reflow is performed to form bonding structures $125_A*$ between die $120_A*$ and die 130. Bonding structures $125_A*$ are formed by bonding the bump structures of dies $120_A*$ with bump structures 138 of die 130. FIG. 3F shows that die $120_A*$ is wider than die 130.

If an underfill 144 is formed in the space between dies $120_A*$ and 130, as shown in FIG. 1B, an underfill material is applied after bonding structures $125_A*$ are formed. The underfill material is then hardened by a thermal process to form underfill 144. However, as mentioned above, the formation of underfill 144 is optional.

Figure 3G:
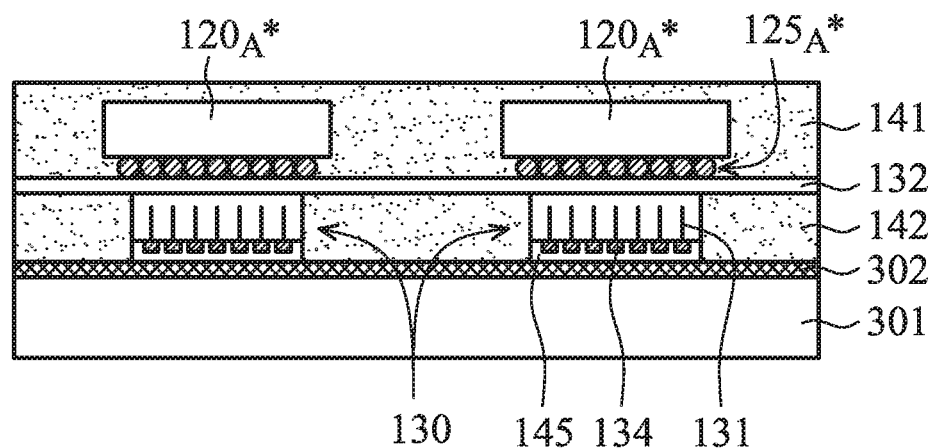

After the bonding structures $125_A*$ or underfill 144 are formed, molding compound 141 is formed to cover dies $120_A*$, as shown in FIG. 3G in accordance with some embodiments. The formation method of molding compound 141 is similar molding compound 142. If underfill 144 is not used, the reflow process to form bonding structures $125_A*$ is skipped, in some embodiments. The thermal process used to harden molding compound 141 may also be used as a reflow process for forming the bonding structures $125_A*$. The molding compound 141 used for package 100* without underfill 144 is a molding underfill (MUF) material. FIG. 3G shows a molding compound 141 formed over dies $120_A*$ and redistribution structure 132, in accordance with some embodiments.

Figure 3H:
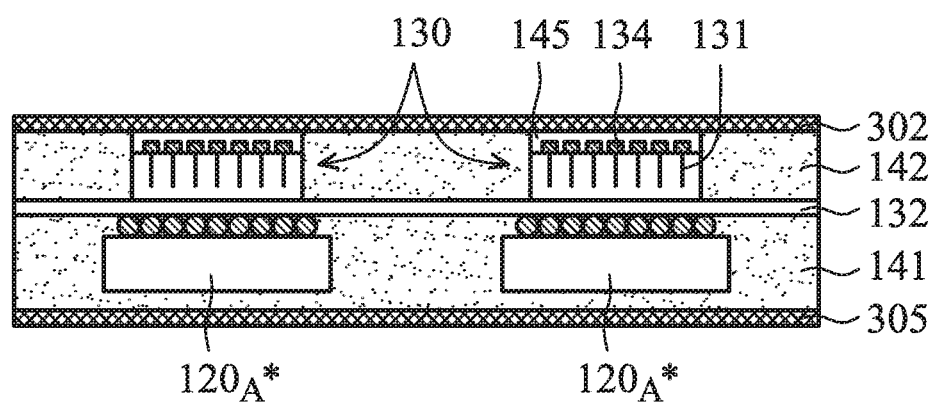
Figure 3I:
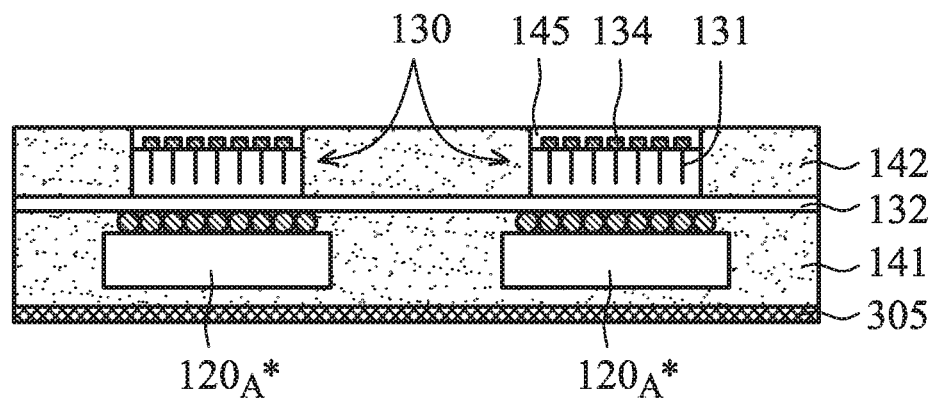

After molding compound 141 is formed, carrier 301 is removed in preparation for singulation of the packaged structures into individual packages 100*. The packaged structure after the carrier 301 is removed is then turned up-side-down and secured to a tape 305, as shown in FIG. 3H in accordance with some embodiments. The excess molding compound 142 and a portion of the protective layer 145 covering the connection structures 134 are removed to expose connection structures 134, as shown in FIG. 3I in accordance with some embodiments. The removal process used may be a grinding process, a polishing process, or an etching process. After the removal process, the remaining portion of the protective layer 145 surrounds the connection structures 134, as shown in FIGS. 3I and 1A, in accordance with some embodiments.

Figure 3J:
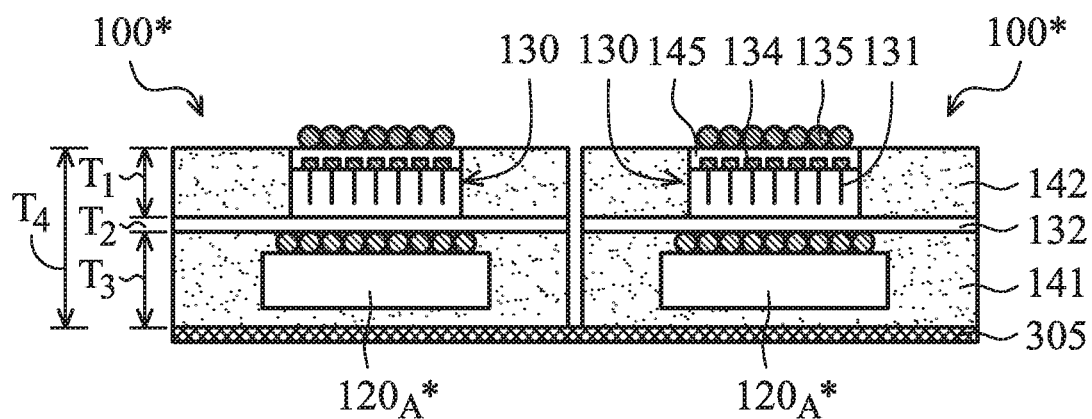

After the connection structures 134 are exposed, external connectors 135, such as solder balls, are placed (or mounted) on connection structures 134. A reflow process is then performed to bond the external connectors 135 to the connection structures 134. A sawing process is then performed to singulate packages into individual package 100*. FIG. 3J shows singulated packages 100* attached to tape 305, in accordance with some embodiments. After package singulation, tape 305 is removed and package 100* is formed. The form factor of package 100* is adequate (i.e. thickness of package 100* is low). The total thickness of package 100*, $T_4$, is in a range from about 90 μm to about 500 μm in some embodiments. The thickness of die 130, $T_1$, is in a range from about 30 μm to about 100 μm in some embodiments. The thickness of die $120_A*$, $T_3$, is in a range from about 50 μm to about 300 μm in some embodiments. The thickness of the redistribution structure 132, $T_2$, is in a range from about 3 μm to about 20 μm in some embodiments. Further, the process flow of forming package 100* is simple.

Figure 3K:
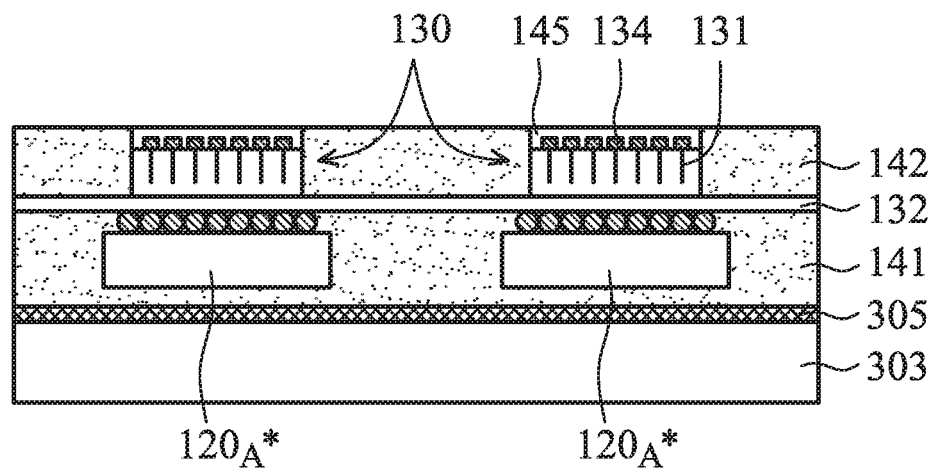
FIGS. 3K-3N show cross-sectional views of a sequential process flow of forming interconnections over connection structures of a package structure, in accordance with some embodiments.
Figure 3L:
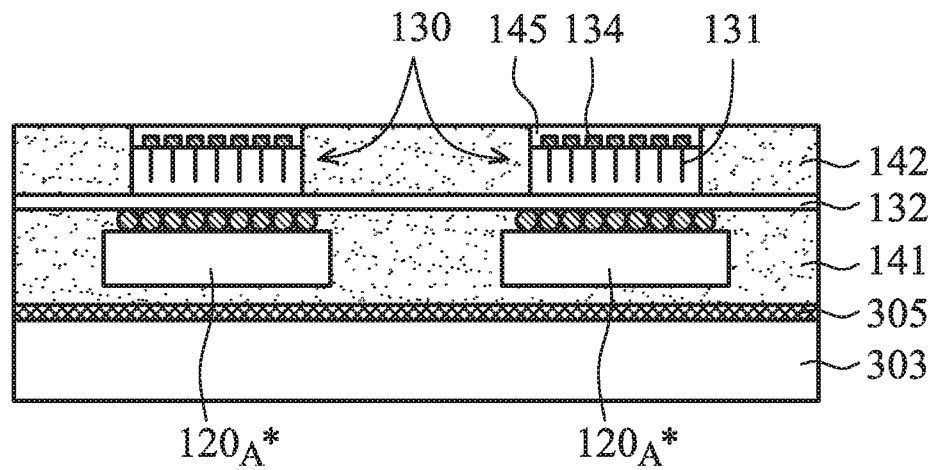

The structures and sequential process flow described above in FIGS. 3A-3J illustrate an exemplary approach to form a package 100* shown in FIG. 1C. In some embodiments, additional interconnections or redistribution structure(s) would need to be formed over connection structures 134 of die 130 to enable routing and bonding for different applications. FIGS. 3K-3N show cross-sectional views of a sequential process flow of forming interconnections over connection structures 134 of die 130 to form packages 100', in accordance with some embodiments. Process sequence of FIGS. 3K-3N continues after the processes described in FIG. 3G. After molding compound 141 is formed as shown in FIG. 3G, carrier 301 and adhesive layer 302 are removed. The package structure of FIG. 3G is attached to an adhesive layer 304, which is attached to a different carrier 303 as shown in FIG. 3K in accordance with some embodiments. As shown in FIG. 3K, the packaged structure after the carrier 301 and adhesive layer 302 are removed is then turned up-side-down and secured to adhesive layer 304. A portion of the protective layer 145 covering the connection structures 134 is then removed to expose connection structures 134, as shown in FIG. 3L in accordance with some embodiments. A portion of molding compound 142 surrounding the portion of the protective layer 145 removed is also removed. The removal process used may be a grinding process, a polishing process, or an etching process. The remaining portion of protective layer 145 surrounds the connection structures 134.

Figure 3M:
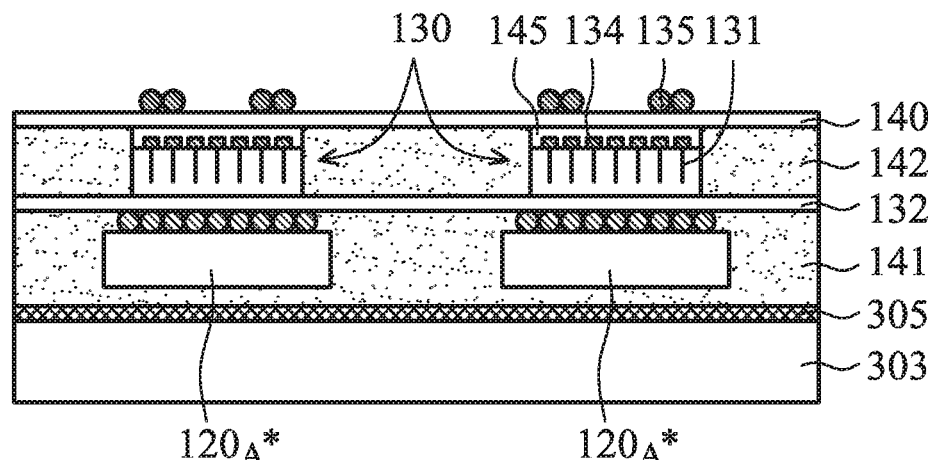

After the connection structures 134 are exposed, a redistribution structure 140 is formed cover the surface of packaged die 130, as shown in FIG. 3M. Redistribution structure 140 includes layers RDLs (or RDL), which enable reconfiguration of bonding structures (not shown), such as bond pads, for external connectors 135 (e.g., contacts) and could also enable fan-out for dies 130 on this side of each die 130 (i.e., an opposite side of the redistribution structure 132). Redistribution structure 140 also includes dielectric layer(s), which is protects and isolate RDLs. After the redistribution structure 140 is formed, external connectors 135 are mounted on bonding pads on the redistribution structure 140, as shown in FIG. 3M in accordance with some embodiments.

Figure 3N:
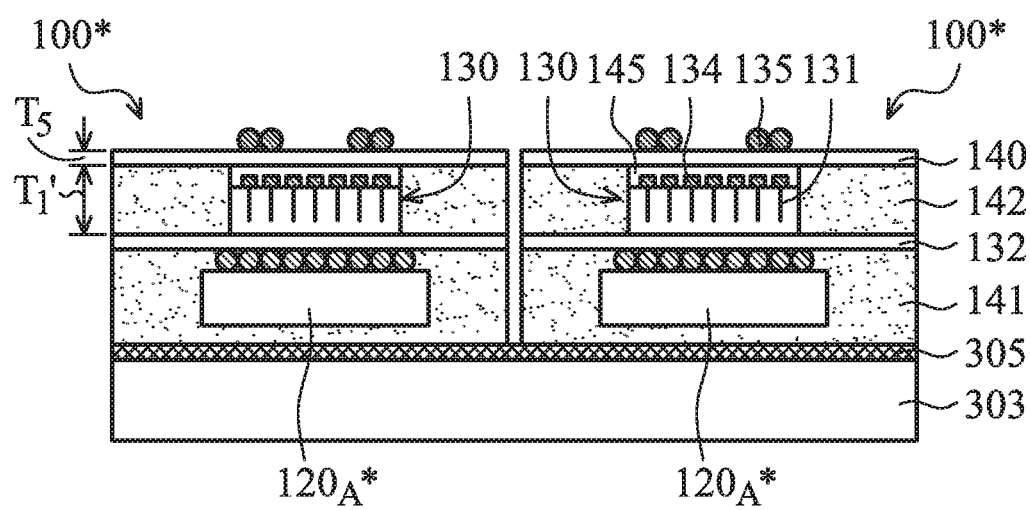

Afterwards, carrier 303 and adhesive layer 304 are removed and be attached to a tape 141 to undergo a sawing process to singulate packages 100'. FIG. 3N shows singulated packages 100' attached to tape 146, in accordance with some embodiments. After package singulation, tape 146 is removed and package 100' is formed. The thickness of die 130 with redistribution structure 140, $T_1'$, is in a range from about 30 µm to about 100 µm in some embodiments. The thickness of redistribution structure 140, $T_5$, is in a range from about 3 µm to about 20 µm in some embodiments.

Figure 4:
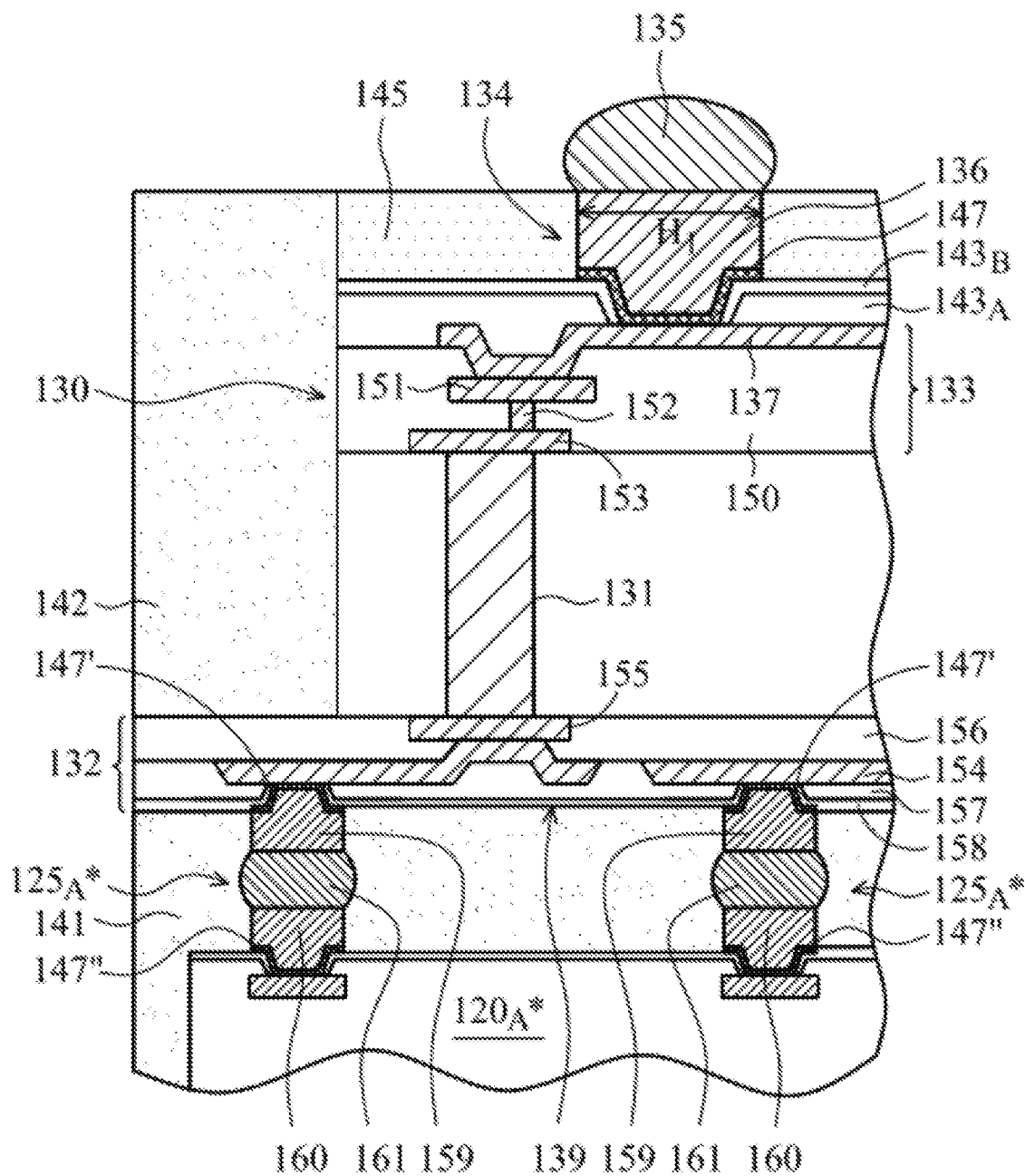
FIG. 4 shows a close up, more detailed view of a portion of a package, in accordance with some embodiments.

FIG. 4 shows a close up, more detailed view of a portion of a package 100*, in accordance with some embodiments. FIG. 4 shows an edge portion of die 130 bonded to die $120_A$*. As shown in FIG. 4, external connectors 135, such as solder bumps, for die 130 are bonded to metal posts 136, which are bonded to metal pads 137 via an under bump metallurgy (UBM layer) 147. In some embodiments, a width $H_1$ of metal post 136 is in a range from about 60 µm to about 320 µm. The metal pad 137, UBM layer 147, metal post 136 form connection structures 134, which are isolated from one another by dielectric layers $143_A$ and $143_B$, in accordance with some embodiments. The connection structures 134 are surrounded by (or embedded in) a protective layer 145, in accordance with some embodiments. Dielectric layers $143_A$ and $143_B$ are made of polymers, in accordance with some embodiments. FIG. 4 also shows TSVs 131 and interconnect structure 133 formed over TSVs 131 of die 130. Interconnect structure 133 includes metal layers 137, 151, and 153, and also via 152, which are insulated by dielectric layer(s) 150. The interconnect structure 133 shown in FIG. 4 is merely an example. There could be additional metal and via layers in the structure.

In some embodiments, the UBM layer 147 includes a diffusion barrier layer and a seed layer. The diffusion barrier layer may also function as an adhesion layer (or a glue layer), in some embodiments. The diffusion barrier layer may be made of Ta, TaN, Ti, TiN, or combination thereof. The seed layer is made of a material to enable deposition of metal posts 146. In some embodiments, the UBM layer 147 includes a diffusion barrier layer formed of Ti and a seed layer formed of Cu. In some embodiments, both the diffusion barrier layer, such as a Ti layer, and the seed layer, such as a Cu layer, are deposited by physical vapor deposition (PVD) (or sputtering) methods.

FIG. 4 also shows redistribution structure 132, which includes RDL 154 formed over a metal layer 155, which is connected to TSV 131. RDL 154 enables fan-out for die 130, and one of the bonding structures $125_A$* between dies 130 and $120_A$* is outside the edge of die 130. Each bonding structures $125_A$* includes UBM layers 147' and 147'', metal posts 159 and 160, and also a bonded solder layer 161, in accordance with some embodiments. In some embodiments, a width $H_2$ of metal posts 159 of bonding structures $125_A$* is in a range from about 5 µm to about 40 µm. Metal posts 159 and metal posts 160 have about the same widths in some embodiments.

RDL 154 is insulated by dielectric layers 156, 157, and 158. In some embodiments, dielectric layers 156, 157 and 158 are passivation layers and are made of polymers. The redistribution structure 132 shown in FIG. 4 is merely an example. There could be additional metal and dielectric layers in the structure to enable interconnection and fan-out.

Details of various exemplary structures of packaged die 130 can be found in U.S. patent application Ser. No. 13/619,877, entitled "3DIC Stacking Device and Method of Manufacture," filed on Sep. 14, 2012, which is incorporated herein by reference in its entirety.

Various embodiments of mechanisms for forming a package with one or more dies over an interposer are provided. By forming a redistribution structure over the interposer with TSVs, the die(s) bonded to the interposer can have edge(s) beyond a boundary of the interposer. In addition, another redistribution structure may be formed on the opposite surface of the interposer from the redistribution structure. The other redistribution structure enables reconfiguration and fan-out of bonding structures for external connectors of the interposer.

In some embodiments, the present disclosure relates to a semiconductor package. The semiconductor package comprises a plurality of through substrate vias (TSVs) extending through an interposer substrate. A redistribution structure is arranged over a first surface of the interposer substrate, and a first die is bonded to the redistribution structure. An edge of the first die is beyond a nearest edge of the interposer substrate. A second die is bonded to the redistribution structure. The second die is laterally separated from the first die by a space.

In some other embodiments, the present disclosure relates to a semiconductor package. The semiconductor package comprises an interposer substrate with through substrate vias (TSVs). A first redistribution layer (RDL) is arranged along a first side of the interposer substrate, and a first die is bonded to the first RDL. A second RDL is arranged along a second side of the interposer substrate and is bonded to external connectors. A protective layer surrounds a first portion of the external connectors. A second portion of the external connectors is exposed by the protective layer.

In yet some embodiments, the present disclosure relates to an integrated chip. The integrated chip comprises a plurality of through substrate vias (TSVs) extending through a semiconductor substrate. A redistribution structure is arranged over the semiconductor substrate and is electrically coupled to the plurality of TSV. A first die is bonded to the redistribution structure, and a second die is bonded to the redistribution structure. The second die is laterally separated from the first die by a space.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:
1. A semiconductor package, comprising:
a plurality of through substrate vias (TSVs) extending through an interposer substrate;
a redistribution structure on a back-side of the interposer substrate, wherein the redistribution structure comprises a conductive redistribution layer that laterally extends from directly over one of the plurality of TSVs to beyond an outermost sidewall of the interposer substrate;
a first die bonded to the redistribution structure, wherein an edge of the first die is beyond a nearest edge of the interposer substrate;
a conductive bonding structure contacting the conductive redistribution layer at a position that is both laterally outside of the interposer substrate and directly below the first die;
a molding compound laterally surrounding the interposer substrate, wherein an imaginary vertical line that is oriented along a direction that is perpendicular to the back-side of the interposer substrate is able to extend through a first interface between the redistribution structure and the conductive bonding structure and through a second interface between the redistribution structure and the molding compound;
an interconnect structure arranged on a front-side of the interposer substrate and comprising a plurality of metal interconnect layers arranged within one or more dielectric layers, wherein the front-side of the interposer substrate faces away from the redistribution structure;
one or more connection structures arranged along the front-side of the interposer substrate and electrically coupled to the interconnect structure; and
a protective layer laterally surrounding the one or more connection structures and having sidewalls aligned with sidewalls of the interposer substrate.

2. The semiconductor package of claim 1, wherein the conductive redistribution layer is disposed within one or more dielectric layers that laterally extend past sidewalls of the first die.

3. The semiconductor package of claim 2, wherein the conductive bonding structure extends from vertically between a bottommost surface of the redistribution structure and the first die to laterally and directly between sidewalls of the redistribution structure.

4. The semiconductor package of claim 1, wherein the redistribution structure comprises a first surface contacting the interposer substrate and continuously extending past the outermost sidewall of the interposer substrate.

5. The semiconductor package of claim 1, further comprising:
a second die bonded to the redistribution structure, wherein the second die is laterally separated from the first die by a non-zero distance that is directly over the interposer substrate, and wherein the redistribution structure laterally extends beyond opposing sidewalls of the first die and the second die.

6. The semiconductor package of claim 5, wherein the redistribution structure further comprises one or more dielectric layers surrounding the conductive redistribution layer.

7. The semiconductor package of claim 1, further comprising:
a second redistribution structure electrically coupled to the one or more connection structures and separated from the redistribution structure by way of the interposer substrate.

8. The semiconductor package of claim 1, further comprising:
a dielectric layer arranged between the protective layer and the interconnect structure and laterally surrounding the one or more connection structures.

9. The semiconductor package of claim 8, wherein the dielectric layer comprises a polymer.

10. A semiconductor package, comprising:
an interposer substrate with through substrate vias (TSVs);
a first redistribution layer (RDL) arranged along a first side of the interposer substrate;
a first die bonded to the first RDL;
a second RDL arranged along a second side of the interposer substrate and laterally extending to opposing outermost edges of the interposer substrate, wherein the second RDL is bonded to the TSVs and to external connectors that are separated from the interposer substrate by the second RDL, and wherein the first RDL laterally extends past outermost sidewalls of both the second RDL and the interposer substrate;
a protective layer surrounding a first portion of the external connectors, wherein a second portion of the external connectors is exposed by the protective layer; and
an interconnect structure arranged between the TSVs and the second RDL and comprising a plurality of metal interconnect layers arranged within one or more dielectric layers.

11. The semiconductor package of claim 10, further comprising:
a dielectric layer arranged between the protective layer and the interconnect structure and laterally surrounding the external connectors.

12. The semiconductor package of claim 10, wherein the first RDL comprises a non-planar layer.

13. An integrated chip, comprising:
a through substrate via (TSV) extending through a semiconductor substrate;
a redistribution structure arranged along a first side of the semiconductor substrate and electrically coupled to the TSV;
a first die bonded to the redistribution structure, wherein the redistribution structure is vertically between the semiconductor substrate and the first die;
a second redistribution structure arranged along a second side of the semiconductor substrate and laterally extending to opposing outermost edges of the semiconductor substrate, wherein the second redistribution structure comprises a second conductive redistribution structure disposed along a sidewall of a dielectric layer;
a plurality of interconnect layers and vias configured to electrically couple the TSV to the second redistribution structure;
an external connector coupled to one of the plurality of interconnect layers and vias by way of the second redistribution structure;
a protective layer arranged on the second redistribution structure and laterally surrounding the external connector, wherein the protective layer has a sidewall that is aligned with a sidewall of the semiconductor substrate;
a molding compound having a sidewall that covers sidewalls of the protective layer and the second redistribution structure, wherein the molding compound is a different layer than the protective layer and wherein the molding compound does not cover a bottom surface of the protective layer facing the semiconductor substrate; and
wherein the redistribution structure comprises a conductive redistribution layer (RDL) that laterally extends past outermost sidewalls of both the second redistribution structure and the semiconductor substrate.

14. The integrated chip of claim 13, further comprising:
a plurality of conductive bonding structures vertically between a top surface of the semiconductor substrate and a bottom surface of the first die, wherein the plurality of conductive bonding structures comprise a first conductive bonding structure contacting the conductive RDL at a position that is both laterally outside of the semiconductor substrate and directly below the first die.

15. The integrated chip of claim 13, further comprising:
a second molding compound laterally surrounding the first die, wherein the second molding compound is completely vertically separated from the molding compound by the redistribution structure on opposing sides of the semiconductor substrate; and
wherein the second molding compound laterally extends past the sidewall of the molding compound facing the semiconductor substrate.

16. The integrated chip of claim 15, wherein the redistribution structure directly contacts the molding compound and the second molding compound.

17. The integrated chip of claim 13, wherein the molding compound has a lower surface that contacts the second redistribution structure and that is directly coupled to the sidewall of the molding compound that directly contacts an outermost sidewall of the dielectric layer.

18. The integrated chip of claim 13, wherein the molding compound is completely confined between an outermost sidewall of the dielectric layer and an outermost sidewall of the redistribution structure.

19. The integrated chip of claim 13,
wherein the conductive RDL is disposed within an additional dielectric structure that vertically and physically contacts the semiconductor substrate; and
wherein the conductive RDL has one or more interior surfaces defining a recess that faces away from the semiconductor substrate, the additional dielectric structure arranged directly between the one or more interior surfaces.

20. The integrated chip of claim 13, further comprising:
a second die bonded to the redistribution structure, wherein the second die is laterally separated from the first die by a non-zero distance that is directly over the semiconductor substrate, and wherein the conductive RDL laterally extends beyond opposing outermost sidewalls of both the first die and the second die.

* * * * *